(12) United States Patent  (10) Patent No.: US 8,853,809 B2
Nakajima et al.  (45) Date of Patent: Oct. 7, 2014

(54) OPTICAL ELEMENT AND PHOTODETECTOR

(71) Applicant: Hamamatsu Photonics K.K., Hamamatsu (JP)

(72) Inventors: Kazutoshi Nakajima, Hamamatsu (JP); Toru Hirohata, Hamamatsu (JP); Wataru Aka-Hori, Hamamatsu (JP); Kazunori Tanaka, Hamamatsu (JP); Kazuue Fujita, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/888,656

(22) Filed: May 7, 2013

(65) Prior Publication Data

US 2013/0307108 A1 Nov. 21, 2013

Related U.S. Application Data

(60) Provisional application No. 61/696,962, filed on Sep. 5, 2012.

(30) Foreign Application Priority Data

May 16, 2012 (JP) ................. 2012-112348

(51) Int. Cl.
*H01L 31/0232* (2014.01)
*G02B 1/00* (2006.01)

(52) U.S. Cl.
CPC .......... *H01L 31/02327* (2013.01); *G02B 1/005* (2013.01)
USPC ................... 257/432; 257/431; 257/E21.127

(58) Field of Classification Search
USPC ................... 257/432, 431, E21.127
See application file for complete search history.

(56) References Cited

U.S. PATENT DOCUMENTS

2012/0182535 A1\* 7/2012 Okazaki et al. ................ 355/67

FOREIGN PATENT DOCUMENTS

| JP | 63-246626 A | 10/1988 |
|---|---|---|
| JP | 2000-156513 A | 6/2000 |
| JP | 2005-159002 A | 6/2005 |
| JP | 2012-83238 | 4/2012 |

OTHER PUBLICATIONS

G. Ariyawansa et al., "Bias-selectable tricolor tunneling quantum dot infrared photodetector for atmospheric windows," Applied Physics Letters, Mar. 19, 2008, pp. 111104-1-111104-3, vol. 92.
Shih-Yen Lin et al., "High-performance InAs/GaAs quantum-odt infrared photodetectors with a single-sided AIO.3GaO.7As blocking layer," Applied Physics Letters, Feb. 16, 2001, pp. 2784-2786, vol. 78, No. 18.

(Continued)

*Primary Examiner* — Timor Karimy
(74) *Attorney, Agent, or Firm* — Drinker Biddle & Reath LLP

(57) ABSTRACT

An optical element 10 for transmitting light therethrough along a predetermined direction and modulating the light comprises a structure 11 having a first region R1 and a second region R2 periodically arranged with respect to the first region R1 along a plane perpendicular to the predetermined direction, the first and second regions R1, R2 having respective refractive indexes different from each other, and properties of transmitting the light therethrough.

24 Claims, 21 Drawing Sheets

(56) References Cited

OTHER PUBLICATIONS

S.C. Lee et al., "Quantum dot infrared photodetector enhanced by surface plasma wave excitation," Optics Express, Dec. 2, 2009, pp. 23160-23168, vol. 17, No. 25.

Chi-Yang Chang et al., "Wavelength selective quantum dot infrared photodetector with periodic metal hole arrays," Applied Physics Letters, Oct. 17, 2007, pp. 163107-1-163107-3, vol. 91.

Wei Wu et al., "Plasmonic enhanced quantum well infrared photodetector with high detectivity," Applied Physics Letters, Apr. 22, 2010, pp. 161107-1-161107-3, vol. 96.

Wei Wu et al, "Plasmonic enhanced quantum well infrared photodetector with high detectivity," Applied Physics Letter, 2010, pp. 161107-1-161107-3, vol. 96.

Muhan Choi et al, "A terahertz metamaterial with unnaturally high refractive index," Nature, Feb. 17, 2011, pp. 369-373, vol. 470.

\* cited by examiner

OPTICAL ELEMENT AND PHOTODETECTOR

CROSS-REFERENCE TO RELATED APPLICATIONS

This application claims priority to a Japanese Patent Application No. 2012-112348 filed on May 16, 2012 and a Provisional Application No. 61/696,962 filed on Sep. 5, 2012 by the same Applicant, which are hereby incorporated by reference in their entirety.

BACKGROUND OF THE INVENTION

1. Field of the Invention

The present invention relates to an optical element for transmitting light therethrough and modulating the light and a photodetector equipped therewith.

2. Related Background Art

Known as photodetectors utilizing light absorption of quantum intersubband transitions are QWIP (quantum well type infrared optical sensor), QDIP (quantum dot infrared optical sensor), QCD (quantum cascade type optical sensor), and the like.

They utilize no energy bandgap transitions and thus have such merits as high degree of freedom in designing wavelength ranges, low dark current, and operability at room temperature.

Among these photodetectors, the QWIP and QCD are equipped with a semiconductor multilayer body having a periodic multilayer structure such as a quantum well structure or quantum cascade structure. This semiconductor multilayer body generates a current due to an electric field component in the stacking direction thereof only when light incident thereon has such an electric field component, and thus is not photosensitive to light having no electric field component in the stacking direction (planar waves incident thereon in the stacking direction thereof).

Therefore, in order for the QWIP or QCD to detect light, it is necessary for the light to be incident thereon such that a direction of vibration of an electric field of the light coincides with the stacking direction of the semiconductor multilayer body. When detecting a planar wave having a wavefront perpendicular to an advancing direction of light, for example, it is necessary for the light to be incident on the semiconductor multilayer body in a direction perpendicular to its stacking direction, which makes the photodetector cumbersome to use.

There has hence been known a photodetector which, for detecting light having no electric field component in the stacking direction of the semiconductor multilayer body, a thin gold film is disposed on a surface of the semiconductor multilayer body and periodically formed with holes each having a diameter not greater than the wavelength of the light (see W. Wu, et al., "Plasmonic enhanced quantum well infrared photodetector with high detectivity", Appl. Phys. Lett., 96, 161107 (2010)). In this example, the light is modulated so as to attain an electric field component in the stacking direction of the semiconductor multilayer body under a surface plasmonic resonance effect on the thin gold film.

There has also been known a photodetector in which a light-transmitting layer is disposed on a surface of a semiconductor multilayer body, while a diffraction grating constituted by a pattern of irregularities and a reflective film covering the same are formed on the light-transmitting layer (see Japanese Patent Application Laid-Open No. 2000-156513). In this example, the light is modulated so as to attain an electric field component in the stacking direction of the semiconductor multilayer body under the effects of diffraction and reflection of the incident light by the diffraction grating and reflective film.

SUMMARY OF THE INVENTION

Thus, for detecting light having no electric field component in the stacking direction of the semiconductor multilayer body, various techniques for modulating the light so as to provide it with an electric field component in the stacking direction have been proposed and desired to attain higher efficiency in such modulation of light.

That is, assuming the stacking direction of the semiconductor multilayer body to be a predetermined direction, there has been a demand for a technique which efficiently modulates light having no electric field component in the predetermined direction such that the light attains an electric field component in the predetermined direction.

It is therefore an object of the present invention to provide an optical element which can efficiently modulate light having no electric field component in a predetermined direction such that the light attains an electric field component in the predetermined direction and a photodetector which, by using a semiconductor multilayer body having a quantum well structure, a quantum cascade structure, or the like, can detect light having no electric field component in the stacking direction of the semiconductor multilayer body.

The optical element in accordance with the present invention is an optical element for transmitting light therethrough along a predetermined direction and modulating the light, the optical element comprising a structure having first regions and second regions periodically arranged with respect to the first regions along a plane perpendicular to the predetermined direction, the first and second regions having respective refractive indexes different from each other, and properties of transmitting the light therethrough.

Light incident on this optical element along a predetermined direction is modulated according to the difference between the respective refractive indexes of the first and second regions periodically arranged along a plane perpendicular to the predetermined direction in the structure and then exits therefrom along the predetermined direction. That is, light having no electric field component in a predetermined direction can efficiently be modulated such as to attain an electric field component in the predetermined direction.

Here, the difference between the refractive indexes of the first and second regions may be 2 or greater. The first and second regions may be arranged with a period of 1 to 500 μm. This can modulate light having no electric field component in a predetermined direction more efficiently so as to provide it with an electric field component in the predetermined direction.

The light transmitted through the optical element of the present invention may be an infrared ray. This allows the optical element of the present invention to be applied favorably to infrared photodetectors.

The structure in the optical element of the present invention may have a film body provided with a plurality of through holes penetrating therethrough along the predetermined direction, the first region being a part between the through holes in the film body, the second region being a space within the through hole. The structure in the optical element of the present invention may have a film body provided with a plurality of depressions opening to one side or the other side in the predetermined direction, the first region being a part between the depressions in the film body, the second region being a space within the depression. The structure in the optical element of the present invention may have a film body provided with a plurality of projections projecting to one side or the other side in the predetermined direction, the first region being the projection, the second region being a space between the projections. The structure having such a film body is inexpensive and easy to manufacture, since it can be formed from a single kind of material. The mode of the structure can be selected from the above as appropriate so that light having no electric field component in a predetermined direction can be modulated more efficiently so as to attain an electric field component in the predetermined direction.

The structure in the optical element of the present invention may have a film body provided with a plurality of through holes penetrating therethrough along the predetermined direction and an embedded member held within the through hole, the first region being a part between the through holes in the film body, the second region being the embedded member. The structure in the optical element of the present invention may have a film body provided with a plurality of depressions opening to one side or the other side in the predetermined direction and an embedded member held within the through hole, the first region being a part between the depressions in the film body, the second region being the embedded member. The structure in the optical element of the present invention may have a film body provided with a plurality of projections projecting to one side or the other side in the predetermined direction and an embedded member held between the projections, the first region being the projection, the second region being the embedded member. These make it possible to select both of materials for the film body and embedded member, thereby enhancing the degree of freedom in adjusting the difference between the refractive indexes of the first and second regions.

The photodetector of the present invention comprises the above-mentioned optical element, a semiconductor multilayer body arranged on the other side opposite to one side in the predetermined direction with respect to the optical element and adapted to generate a current due to an electric field component in the predetermined direction in the light transmitted through the optical element, a first contact layer formed on a surface on the one side of the semiconductor multilayer body, and a second contact layer formed on a surface on the other side of the semiconductor multilayer body.

Since this photodetector is equipped with the above-mentioned optical element, the light incident thereon is modulated in the process of being transmitted through the optical element. The modulated light has an electric field component in the stacking direction of the semiconductor multilayer body, so that the electric field component generates a current in the semiconductor multilayer body. That is, by using a semiconductor multilayer body having a quantum well structure, a quantum cascade structure, or the like, this photodetector can detect light having no electric field component in the stacking direction of the semiconductor multilayer body.

The photodetector of the present invention may further comprise a substrate having the second contact layer, semiconductor multilayer body, first contact layer, and optical element sequentially stacked thereon from the other side. This can stabilize individual constructions of the photodetector.

The photodetector of the present invention may further comprise a first electrode electrically connected to the first contact layer and a second electrode electrically connected to the second contact layer. This makes it possible to efficiently detect the current generated in the semiconductor multilayer body.

In the photodetector of the present invention, the optical element may generate the electric field component in the predetermined direction either when light is incident thereon from the one side or through the semiconductor multilayer body from the other side.

The present invention can provide an optical element which can efficiently modulate light having no electric field component in a predetermined direction such that the light attains an electric field component in the predetermined direction and a photodetector which, by using a semiconductor multilayer body having a quantum well structure, a quantum cascade structure, or the like, can detect light having no electric field component in the stacking direction of the semiconductor multilayer body.

DESCRIPTION OF THE PREFERRED EMBODIMENTS

Figure 1:
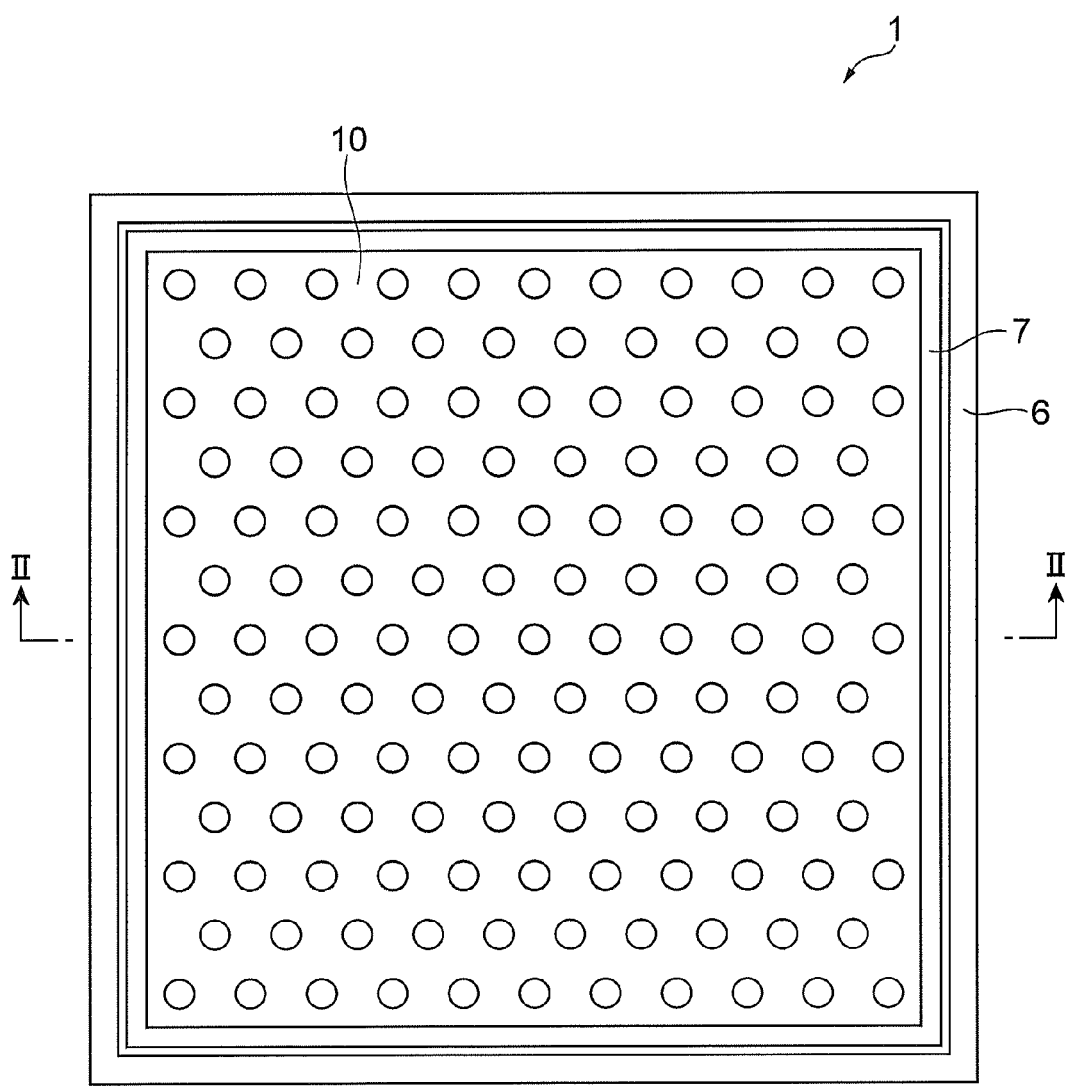
FIG. 1 is a plan view of the photodetector in accordance with a first embodiment of the present invention.

In the following, preferred embodiments of the present invention will be explained with reference to the drawings. The same or equivalent parts in the drawings will be referred to with the same signs, while omitting their overlapping descriptions. By "refractive index" in the specification is meant the refractive index for incident light. The light to be detected by photodetectors of the embodiments is an infrared ray (light having a wavelength of 2 to 1000 μm).

First Embodiment

Figure 2:
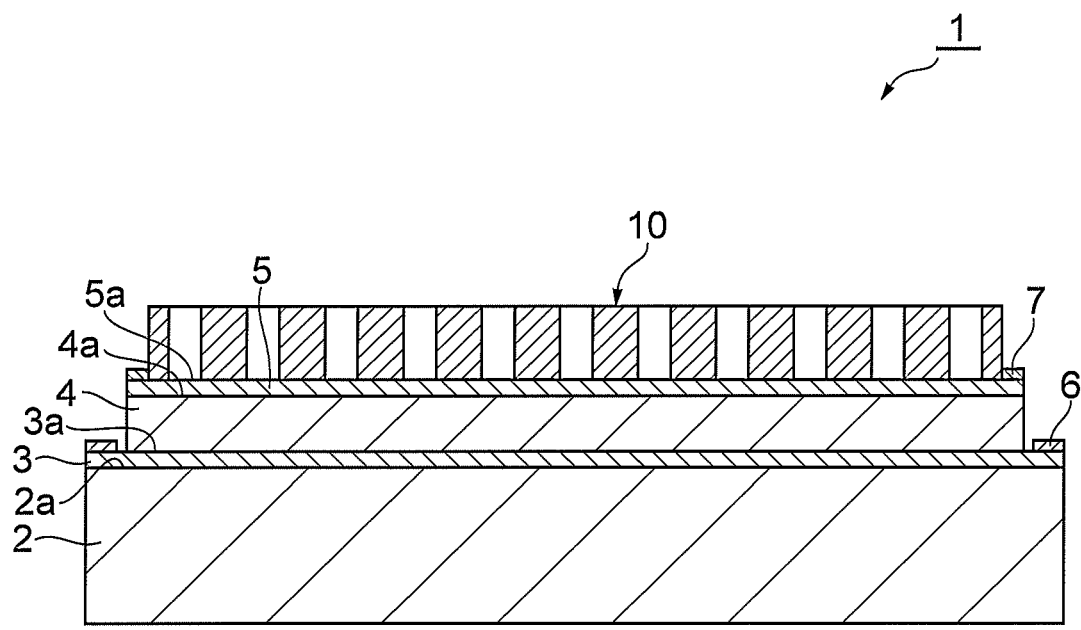
FIG. 2 is a sectional view taken along the line II-II of FIG. 1.

As illustrated in FIGS. 1 and 2, a photodetector 1 comprises a rectangular plate-shaped substrate 2 made of InP and contact layers 3, 5, a semiconductor multilayer body 4, electrodes 6, 7, and an optical element 10 which are stacked thereon. This photodetector 1 is a photodetector which utilizes light absorption of quantum intersubband transitions in the semiconductor multilayer body 4.

The contact layer (second contact layer) 3 is provided throughout a surface 2a of the substrate 2. At the center of a surface 3a of the contact layer 3, the semiconductor multilayer body 4 having an area smaller than the whole area of the surface 3 is disposed. That is, the semiconductor multilayer body 4 is arranged so as to be contained in the contact layer 3 when seen as a plane. In a peripheral region free of the semiconductor multilayer body 4 in the surface 3a, the electrode (second electrode) 6 is formed like a ring so as to surround the semiconductor multilayer body 4.

The contact layer (first contact layer) 5 is provided throughout a surface 4a of the semiconductor multilayer body 4. At the center of a surface 5a of the contact layer 5, the optical element 10 having an area smaller than the whole area of the surface 5a is disposed. That is, the optical element 10 is arranged so as to be contained in the contact layer 5 when seen as a plane. In a peripheral region free of the optical element 10 in the surface 5a, the electrode (first electrode) 7 is formed like a ring so as to surround the optical element 10.

The semiconductor multilayer body 4 has a multiple quantum well structure (or multiple quantum cascade structure) designed so as to correspond to the wavelength of the light to be detected, in which, specifically, semiconductor layers of InGaAs and InAlAs having respective energy bandgaps different from each other are stacked alternately with a thickness of several nm each.

The contact layers 3, 5, which are made of InGaAs, are respective layers for electrically linking the semiconductor multilayer body 4 to the electrodes 6, 7 in order to detect a current generated in the semiconductor multilayer body 4. The electrodes 6, 7 are made of AuGe, Ti/Pt/Au, or the like.

Figure 3:
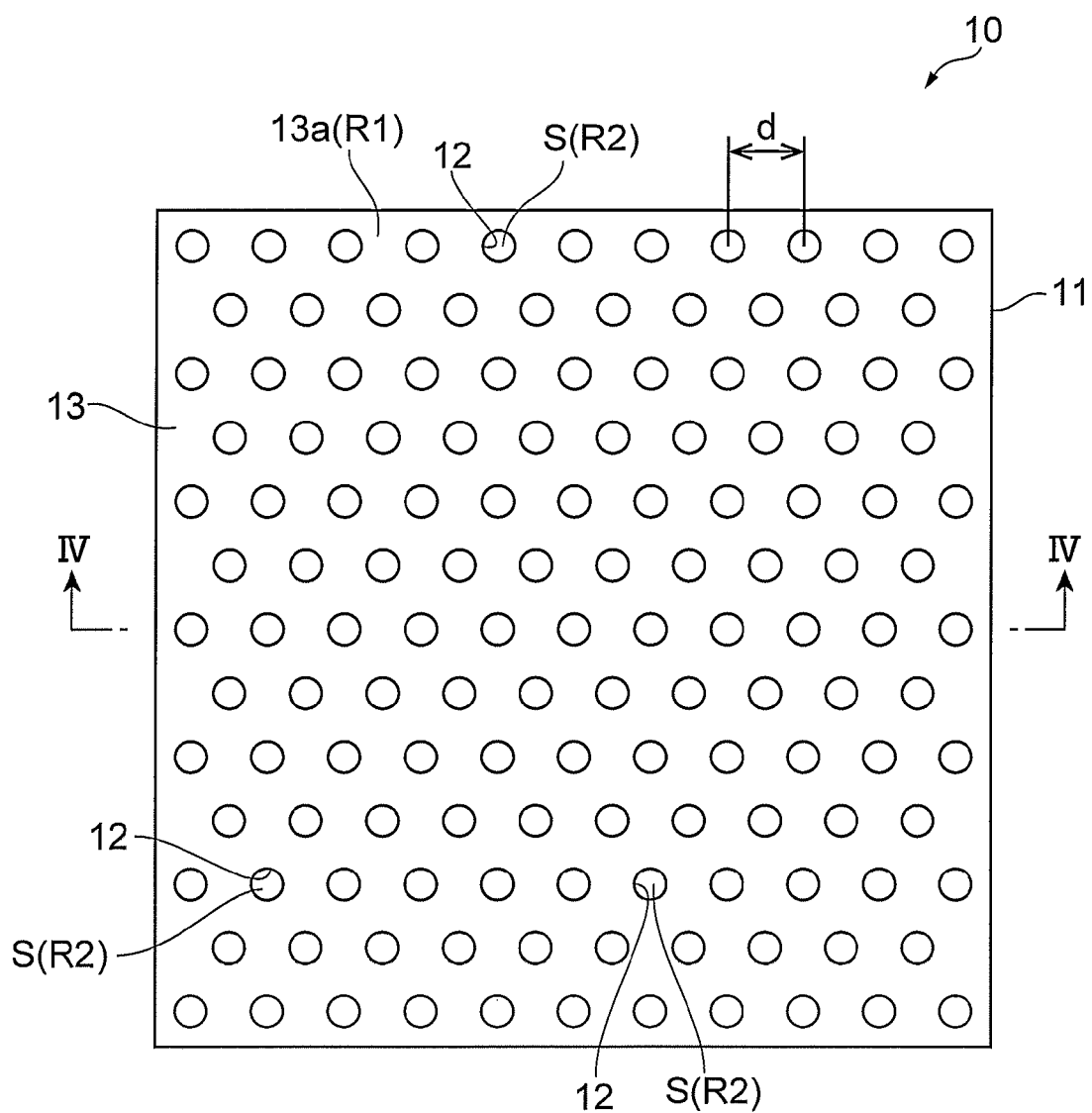
FIG. 3 is a plan view of the optical element in accordance with the first embodiment of the present invention.
Figure 4:
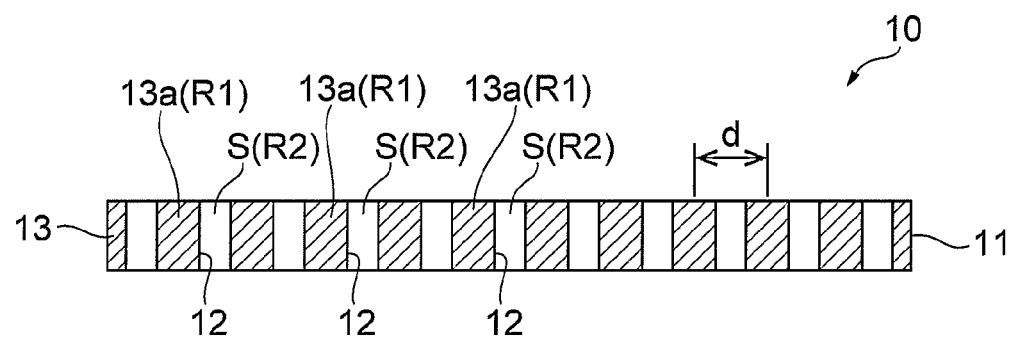
FIG. 4 is a sectional view taken along the line IV-IV of FIG. 3.

The optical element 10 is an optical element for transmitting light therethrough from one side to the other side in a predetermined direction and modulating the light. As illustrated in FIGS. 3 and 4, the optical element 10 is equipped with a structure 11, which has first regions R1 and second regions R2 periodically arranged with respect to the first regions R1 along a plane perpendicular to the predetermined direction with a period d which is 1 to 500 μm according to the wavelength of the incident light. The first and second regions R1, R2 have respective refractive indexes different from each other, and properties of transmitting the light incident thereon.

The structure 11 has a film body 13 provided with a plurality of through holes 12 penetrating therethrough from one side to the other side in the predetermined direction. The plurality of through holes 12 are arranged into a triangular lattice when seen as a plane with respect to the film body 13 as illustrated in FIG. 3, while each through hole 12 has a cylindrical form and penetrates through the film body 13 from one side to the other side in the predetermined direction (the stacking direction of the semiconductor multilayer body 4 in FIG. 2) as illustrated in FIG. 4. Preferably, the film body 13 has a thickness of 10 nm to 2 μm.

Here, the first region R1 is a part 13a between the through holes 12 in the film body 13 and specifically made of germanium. The second region R2 is a space S within the through hole 12, which is specifically an air. That is, when the photodetector 1 is seen as a plane from the photodetector 10 side (i.e., in FIG. 1), a part of the contact layer 5 is seen through the through holes 12. The difference between the respective refractive indexes of the first and second regions R1, R2 is preferably 2 or greater, more preferably 3 or greater. For mid-infrared light having a wavelength of 5 μm, for example, germanium and the air exhibit refractive indexes of 4.0 and 1.0, respectively, thus yielding a refractive index difference of 3.0 in this embodiment.

The photodetector 1 is equipped with the optical element 10 as mentioned above, whereby light incident on the optical element 10 from one side in the predetermined direction (e.g., a planar wave incident thereon in the stacking direction of the semiconductor multilayer body 4) is modulated according to the difference between the respective refractive indexes of the first and second regions R1, R2 periodically arranged along a plane perpendicular to the predetermined direction in the structure 11 and then exits from the other side in the predetermined direction. That is, light having no electric field component in the predetermined direction can be modulated efficiently so as to attain an electric field component in the predetermined direction. Since the plurality of through holes 12 are arranged into a triangular lattice in the film body 13, the optical element 10 depends less on the polarization direction of incident light in particular. While the difference between the respective refractive indexes of the first and second regions R1, R2 is 2 or greater, the period d of arrangement of the first and second regions R1, R2 is 1 to 500 μm, which is determined according to the wavelength of the incident light, whereby the light is modulated more efficiently. The structure 11 in the optical element 10 has the film body 13 provided with a plurality of through holes 12 penetrating therethrough from one side to the other side, the first region R1 is the part 13a between the through holes 12 in the film body 13, and the second region R2 is the space S within the through hole 12. Therefore, the structure 11 can be formed from a single kind of material and thus is inexpensive and easy to manufacture.

Thus modulated light has an electric field component in the stacking direction of the semiconductor multilayer body 4, so that the electric field component is absorbed into the multiple quantum well structure (or multiple quantum cascade structure), so as to generate a photoelectron, which is detected as a current through the electrodes 6, 7. That is, this photodetector 1 can detect light having no electric field component in the stacking direction of the semiconductor multilayer body 4. Since the photodetector of the present invention further comprises the substrate 2 for supporting the contact layers 5, 6, semiconductor multilayer body 4, and optical element 10, the individual constructions of the photodetector 1 are made stable. The photodetector 1 further comprises the electrode 7 formed on the contact layer 5 and the electrode 6 formed on the contact layer 3, the optical element 10 is arranged so as to be contained in the contact layer 5 when seen from one side, the semiconductor multilayer body 4 is arranged so as to be contained in the contact layer 3 when seen from one side, the electrode 7 is formed like a ring in a region free of the optical element 10 in the surface 5a on one side of the contact layer 5 so as to surround the optical element 10, and the electrode 6 is formed like a ring in a region free of the semiconductor multilayer body 4 in the surface 3a on one side of the contact layer 3 so as to surround the semiconductor multilayer body 4. This makes it possible to efficiently detect the current generated in the semiconductor multilayer body 4.

In the photodetector described in W. Wu, et al., "Plasmonic enhanced quantum well infrared photodetector with high detectivity", Appl. Phys. Lett., 96, 161107 (2010), a part of incident light (an infrared ray) is blocked by a thin gold film, while the surface plasmonic resonance itself incurs such a large energy loss as to lower photosensitivity. Since the surface plasmonic resonance is known as a resonant state of a vibration resultantly occurring when a free electron in a metal combines with an electric field component in light or the like, in order to utilize the surface plasmonic resonance, there is a restriction that the free electron must exist on a surface where the light is incident. In the photodetector 1 of this embodiment, by contrast, each of the first and second regions R1, R2 have properties of transmitting the incident light, while no surface plasmonic resonance is utilized for modulating the light, whereby the photosensitivity does not decrease as seen in the photodetector described in the literature, while materials for use are not limited to metals having free electrons.

On the other hand, the photodetector described in Japanese Patent Application Laid-Open No. 2000-156513 has a low degree of freedom in designing as a photodetector, since a diffraction grating is formed on a surface of a light-transmitting layer. In the photodetector 1 of this embodiment, by contrast, the optical element 10 is formed separately from the contact layer 5, whereby materials having desirable refractive indexes and techniques for forming and processing the optical element 10 can be selected from wide ranges. Therefore, the photodetector 1 of this embodiment has a high degree of freedom in designing according to the wavelength of incident light, desirable photosensitivity, and the like.

Figure 5:
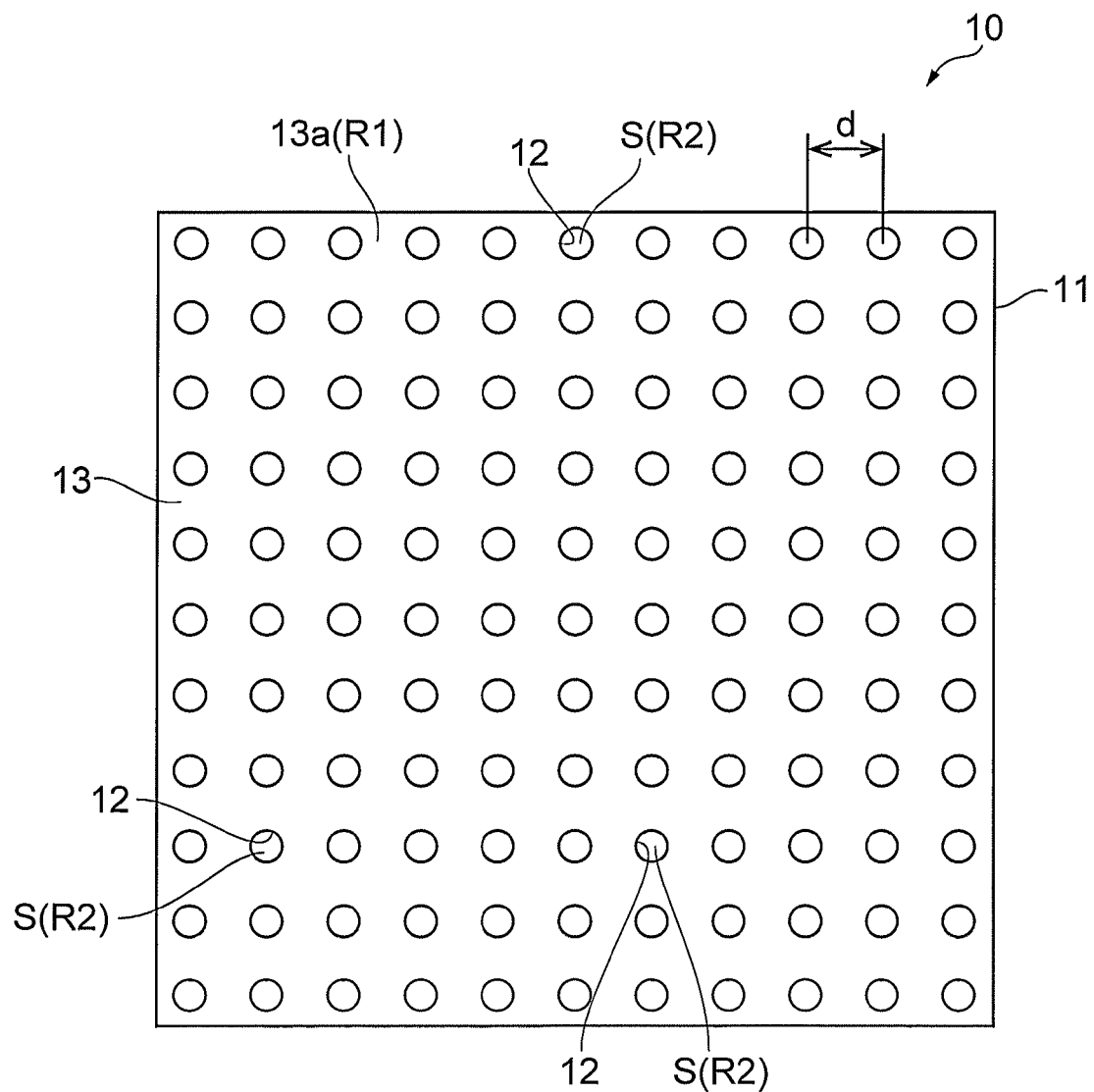
FIG. 5 is a plan view of a modified example of the optical element in accordance with the first embodiment of the present invention.

The photodetector 1 of the first embodiment may have the optical element 10 in another mode. For example, as illustrated in FIG. 5, the plurality of through holes 12 in the film body 13 in the optical element 10 may be arranged into a square lattice instead of the triangular lattice. This achieves a higher efficiency in modulating light when the incident light is linearly polarized light than in the triangular lattice arrangement.

Though a case where light is incident on the optical element 10 from one side in the predetermined direction is explained in the photodetector 1, light may be made incident on the photodetector 1 from the rear side (the other side in the predetermined direction) and detected. This can avoid the optical element 10 from reflecting and absorbing the incident light and thus can further enhance the photosensitivity. Furthermore, while the photodetector 1 is mounted by flip chip bonding onto a package, a submount, IC, or the like, light can easily be made incident thereon, which has a merit in that it expands possibility of developing into image sensors and the like in particular.

Second Embodiment

Figure 6:
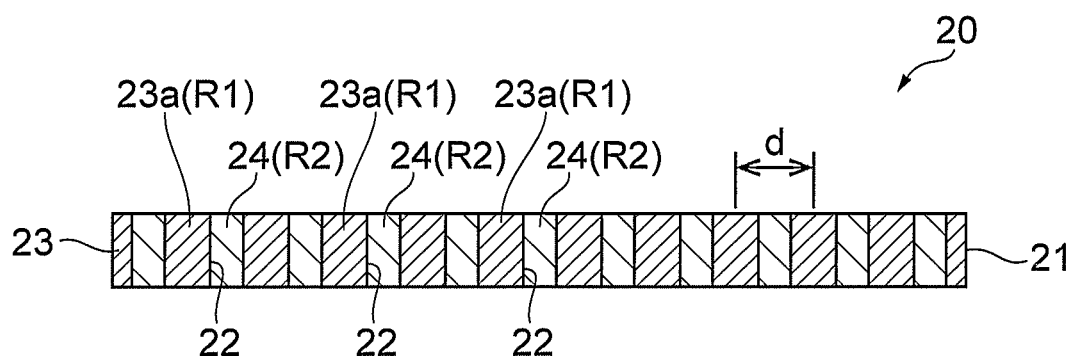
FIG. 6 is a sectional view of the optical element in accordance with a second embodiment of the present invention.

Another embodiment of the photodetector will now be explained as the second embodiment of the present invention. The photodetector of the second embodiment differs from the photodetector 1 of the first embodiment in that an optical element 20 illustrated in FIG. 6 is used in place of the optical element 10.

The optical element 20 is equipped with a structure 21, which has first regions R1 and second regions R2 periodically arranged with respect to the first regions R1 as in the optical element 10 in the first embodiment. The first and second regions R1, R2 have respective refractive indexes different from each other, and properties of transmitting the light incident thereon.

The structure 21 has a film body 23 provided with a plurality of through holes 22 penetrating therethrough from one side to the other side in the predetermined direction and embedded members 24 held within the respective through holes 22. The plurality of through holes 22 and embedded members 24 are arranged into a triangular lattice when seen as a plane with respect to the film body 23 as in the optical element 10 in the first embodiment, while each of the through holes 22 and embedded members 24 has a cylindrical form and penetrates through the film body 23 from one side to the other side in the predetermined direction (the stacking direction of the semiconductor multilayer body 4 in FIG. 2) as illustrated in FIG. 6. Preferably, the film body 23 has a thickness of 10 nm to 2 μm.

Here, the first region R1 is a part 23a between the through holes 22 in the film body 23, while the second region R2 is the embedded member 24. Examples of materials constituting the first region R1 include those of the optical element 10 in the first embodiment. Examples of materials for constructing the embedded member 24 include silicon dioxide, silicon nitride, and aluminum oxide. Silicon dioxide exhibits a refractive index of 1.3 for mid-infrared light having a wavelength of 5 μm, for example. In this case, a material exhibiting a refractive index of 3.3 or greater at this wavelength is preferably used as a material for the first region R1; for example, silicon exhibiting a refractive index of 3.4 for the mid-infrared light having a wavelength of 5 μm is preferred as a material constituting the first region R1.

The optical element 20 can select both of materials for the film body 23 and embedded member 24 as mentioned above and thus has a high degree of freedom in adjusting the difference between the refractive indexes of the first and second regions R1, R2.

Third Embodiment

Figure 7:
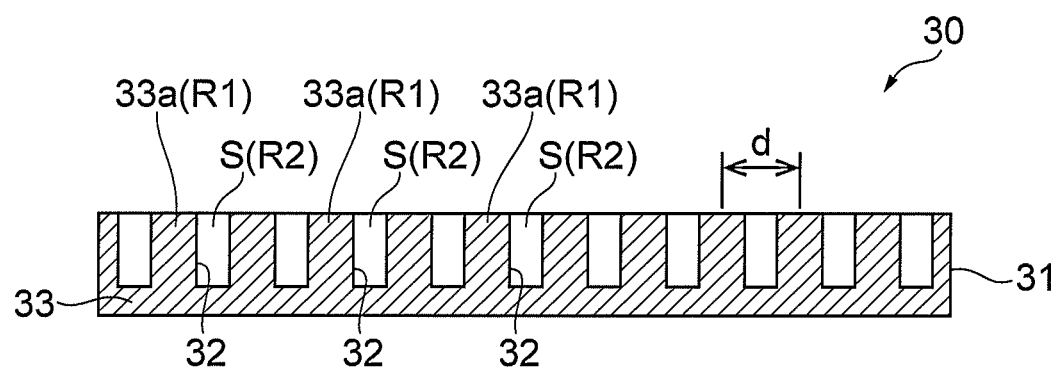
FIG. 7 is a sectional view of the optical element in accordance with a third embodiment of the present invention.

Another embodiment of the photodetector will now be explained as the third embodiment of the present invention. The photodetector of the third embodiment differs from the photodetector 1 of the first embodiment in that an optical element 30 illustrated in FIG. 7 is used in place of the optical element 10.

The optical element 30 is equipped with a structure 31, which has a first region R1 and second regions R2 periodically arranged with respect to the first region R1 as in the optical element 10 in the first embodiment. The first and second regions R1, R2 have respective refractive indexes different from each other, and properties of transmitting the light incident thereon.

The structure 31 has a plurality of depressions 32 opening to one side. The plurality of depressions 32 are arranged into a triangular lattice when seen as a plane with respect to the film body 33 as in the optical element 10 in the first embodiment, while each depression 32 has a cylindrical form. Preferably, the film body 33 has a thickness of 10 nm to 2 μm.

Here, the first region R1 is a part 33a between the depressions 32 in the film body 33, while the second region R2 is a space S within the depression 32. Examples of materials constituting the first and second regions R1, R2 include those of the optical element in the first embodiment.

The optical element 30 has no through holes penetrating therethrough from one side to the other side in the predetermined direction as mentioned above, so that fine particles in the air and the like do not physically pass from one side to the other side. That is, the optical element 30 acts as a surface protecting material for the photodetector of this embodiment employing the optical element 30, whereby the photodetector is restrained from deteriorating.

Figure 8:
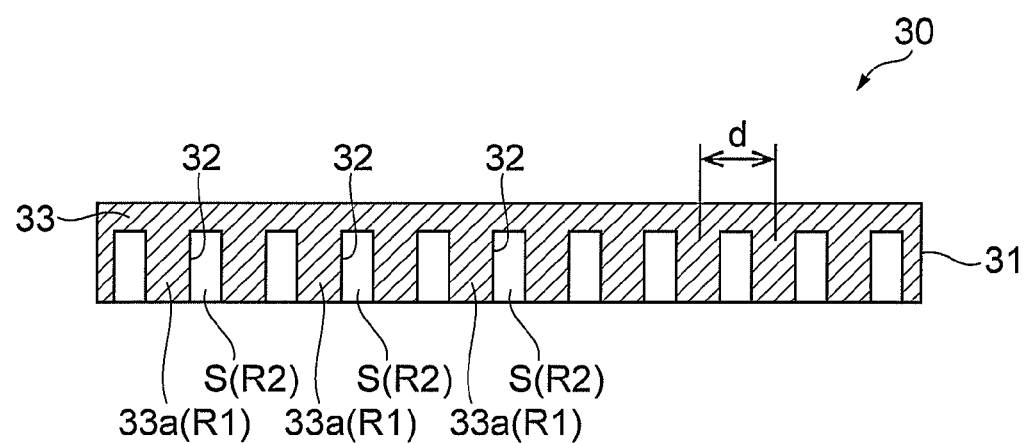
FIG. 8 is a sectional view of a modified example of the optical element in accordance with the third embodiment of the present invention.

The photodetector of the third embodiment may have the optical element 30 in another mode. For example, as illustrated in FIG. 8, the plurality of depressions 32 may open to the other side instead of the one side in the optical element 30. Embedded members may be held within the depressions 32 as in the optical element 20 in the second embodiment.

Fourth Embodiment

Figure 9:
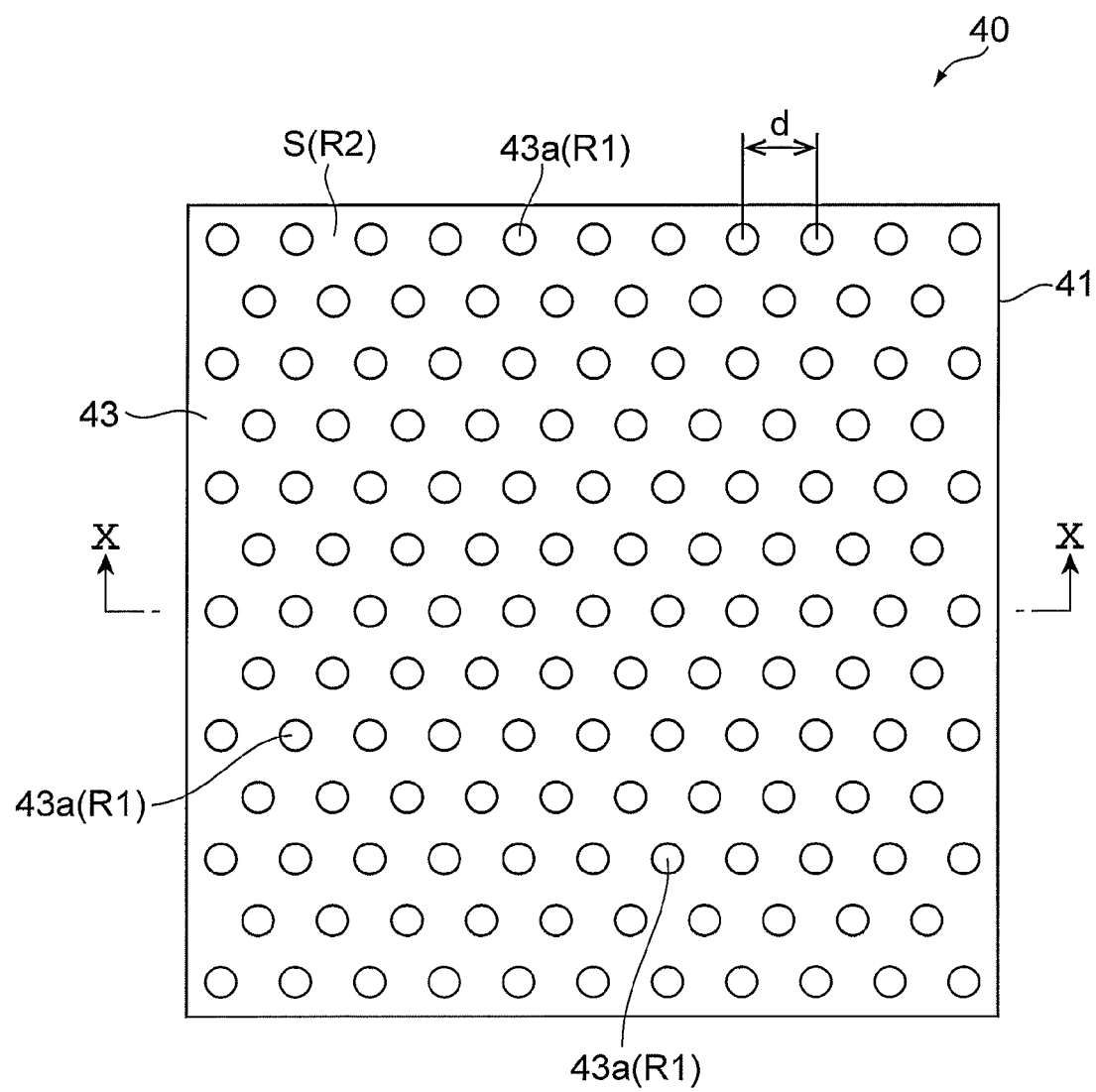
FIG. 9 is a plan view of the photodetector in accordance with a fourth embodiment of the present invention.
Figure 10:
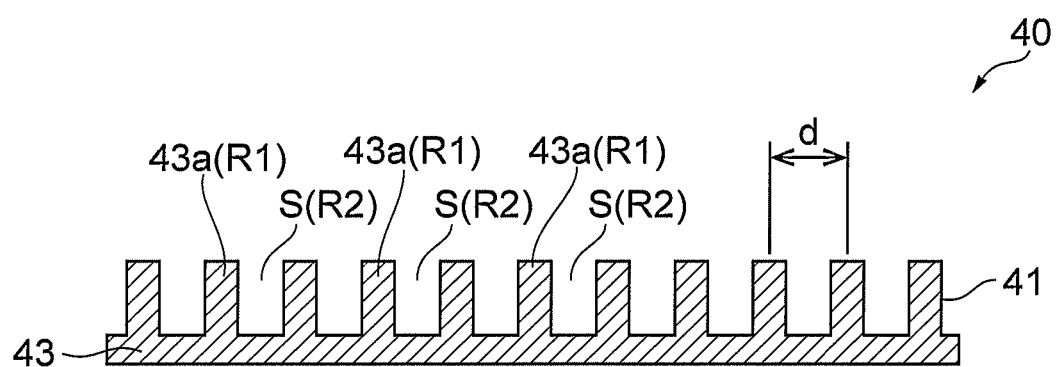
FIG. 10 is an end face view taken along the line X-X of FIG. 9.

Another embodiment of the photodetector will now be explained as the fourth embodiment of the present invention. The photodetector of the fourth embodiment differs from the photodetector 1 of the first embodiment in that an optical element 40 illustrated in FIGS. 9 and 10 is used in place of the optical element 10.

The optical element 40 is equipped with a structure 41, which has first regions R1 and second regions R2 periodically arranged with respect to the first regions R1 as in the optical element 10 in the first embodiment. The first and second regions R1, R2 have respective refractive indexes different from each other, and properties of transmitting the light incident thereon.

The structure 41 has a film body 43 provided with a plurality of projections 43a projecting to one side. The plurality of projections 43a are arranged into a triangular lattice when seen as a plane with respect to the film body 43 as in the optical element 10 in the first embodiment, while each depression 43a has a cylindrical form and projects from the other side to the one side in the predetermined direction as illustrated in FIGS. 9 and 10. Preferably, the film body 43 has a thickness (including the height of the projection 43a) of 10 nm to 2 µm.

Here, the first region R1 is the projection 43a in the film body 43, while the second region R2 is a space S between the projections 43a. Examples of materials constituting the first and second regions R1, R2 include those of the optical element 10 in the first embodiment.

The photodetector of the fourth embodiment may have the optical element 40 in another mode. For example, the plurality of projections 43a may project from the one side to the other side in the optical element 40. Embedded members may be held between the projections 43a as in the optical element 20 in the second embodiment.

Fifth Embodiment

Figure 11:
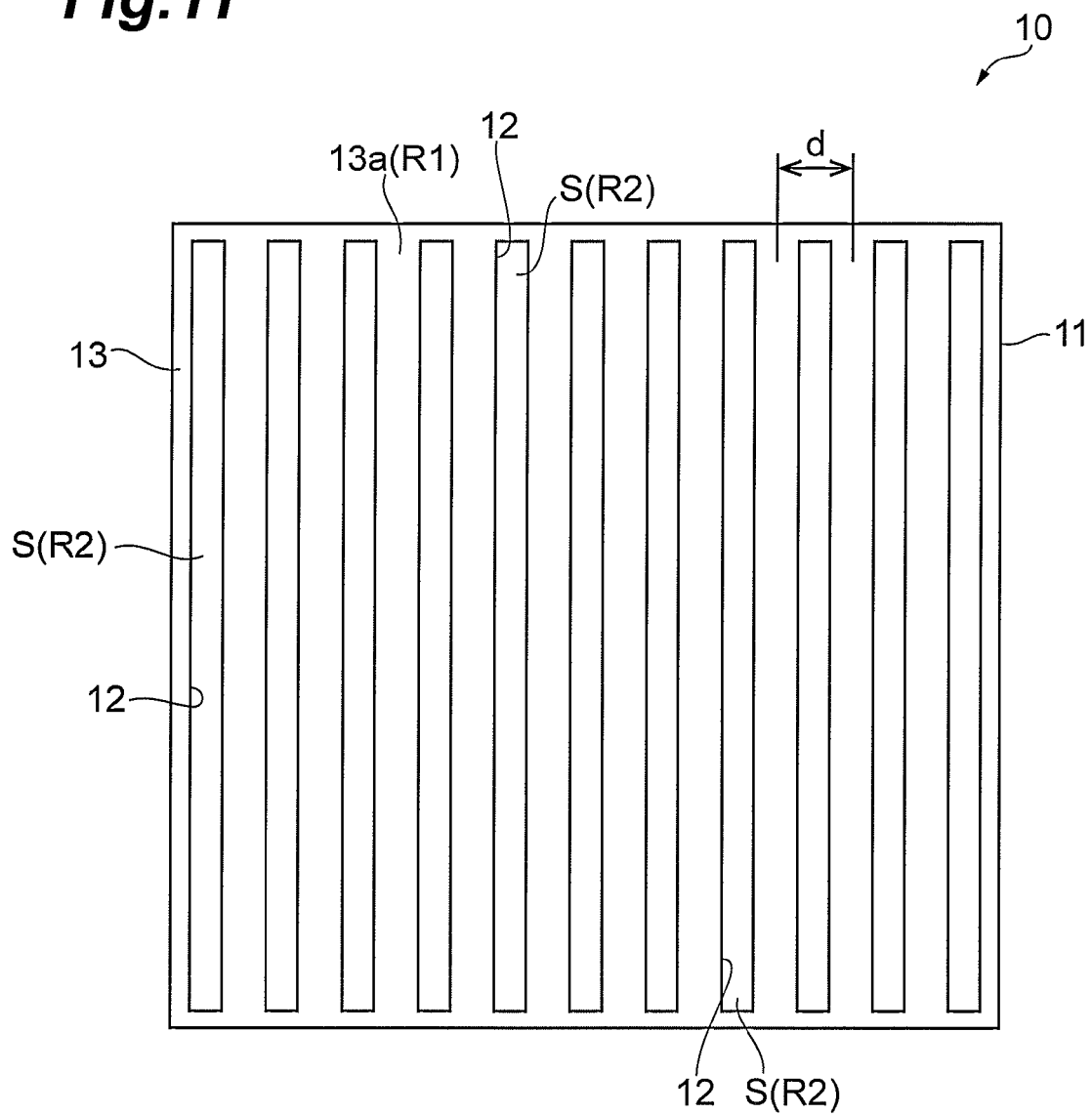
FIG. 11 is a plan view of the optical element in accordance with a fifth embodiment of the present invention.

Another embodiment of the photodetector will now be explained as the fifth embodiment of the present invention. The photodetector of the fifth embodiment differs from the photodetector 1 of the first embodiment in that through holes in its optical element 10 have a slit form as illustrated in FIG. 11 instead of the cylindrical form.

The slit-shaped through holes 12 are arranged in a row in a direction perpendicular to the longitudinal direction of the slit form. This optical element 10 has a characteristic feature of yielding a higher efficiency for modulating light when the incident light is linearly polarized light as compared with the optical element 10 illustrated in FIG. 5.

Sixth Embodiment

Figure 12:
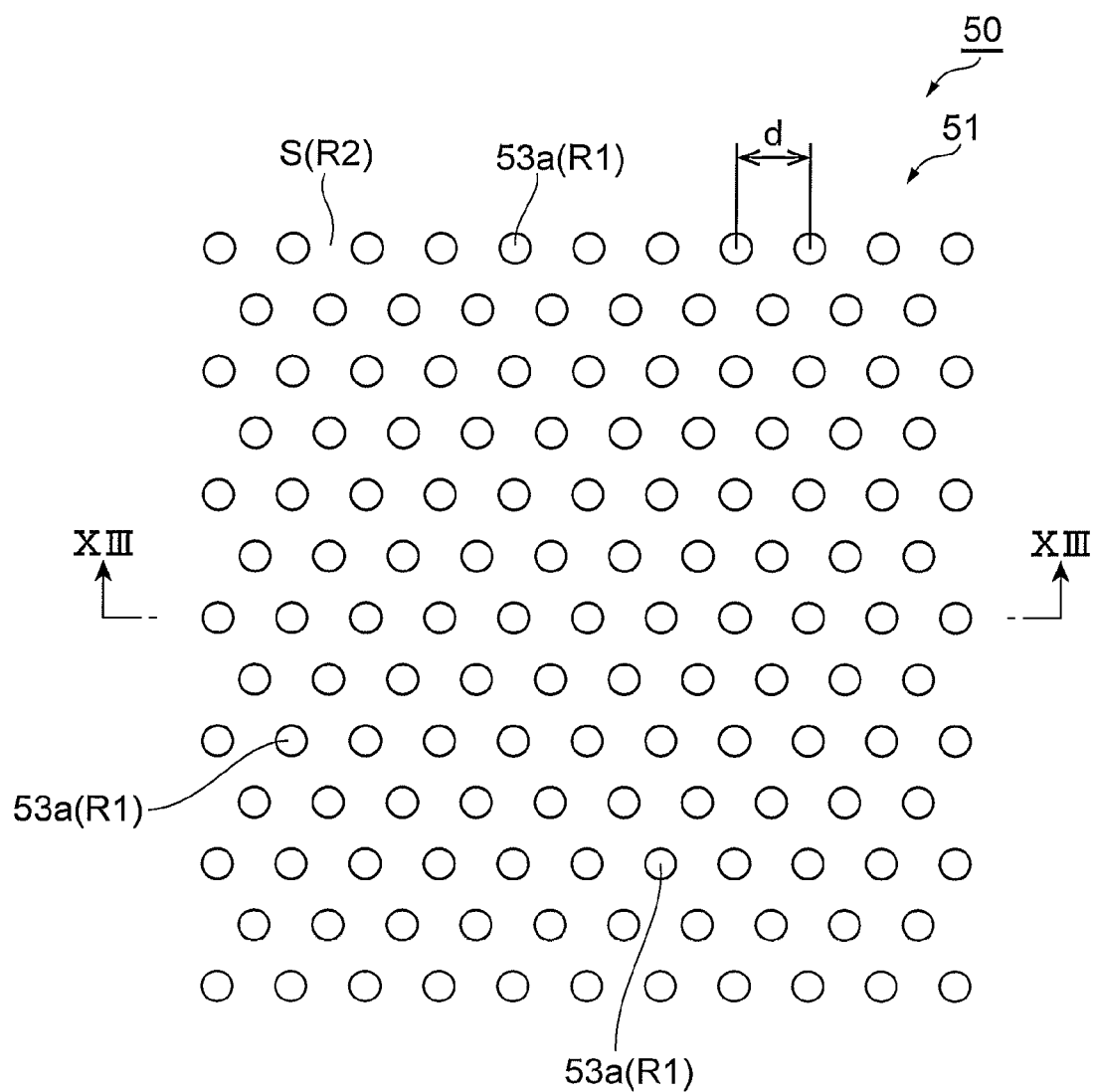
FIG. 12 is a plan view of the optical element in accordance with a sixth embodiment of the present invention.
Figure 13:
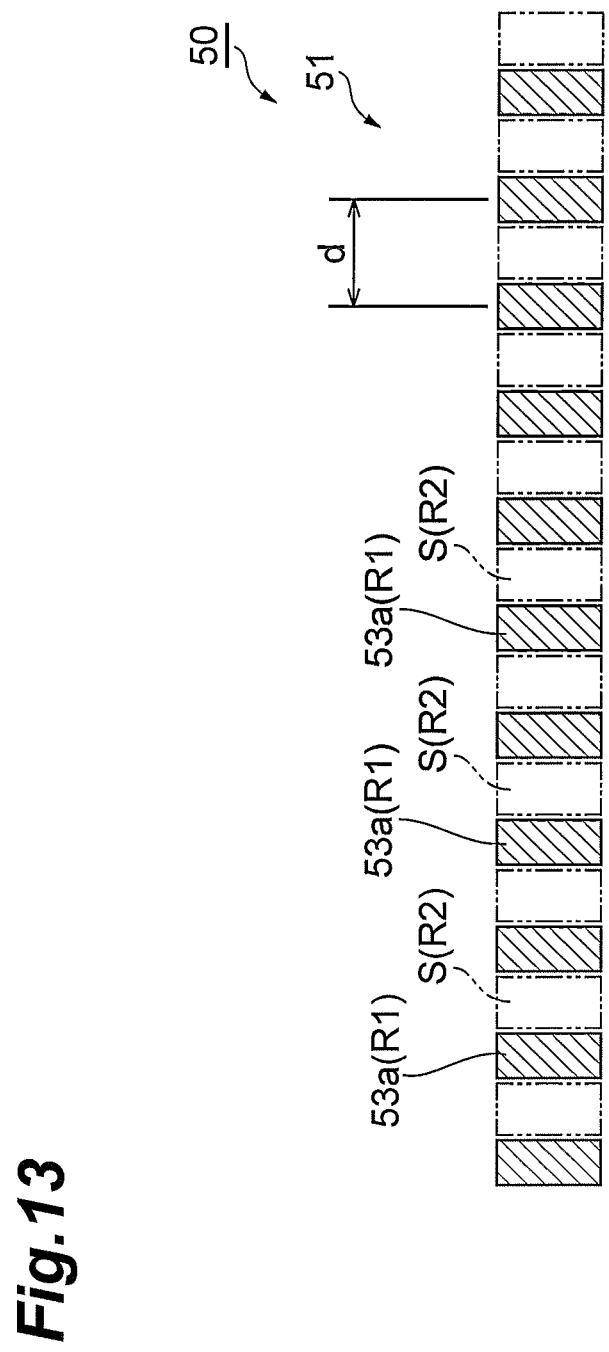
FIG. 13 is an end face view taken along the line XIII-XIII of FIG. 12.

Another embodiment of the photodetector will now be explained as the sixth embodiment of the present invention. The photodetector of the sixth embodiment differs from the photodetector 1 of the first embodiment in that an optical element 50 illustrated in FIGS. 12 and 13 is used in place of the optical element 10.

The optical element 50 is equipped with a structure 51, which has first regions R1 and second regions R2 periodically arranged with respect to the first regions R1. The first and second regions R1, R2 have respective refractive indexes different from each other, and properties of transmitting the light incident thereon.

The structure 51 is constructed by arranging a plurality of cylindrical bodies 53a having the same form with a height in the predetermined direction into a triangle lattice along a plane perpendicular to the predetermined direction when seen as a plane. Preferably, the height of the cylindrical body 53a is 10 nm to 2 µm.

Here, the first region R1 is the cylindrical body 53a, while the second region R2 is a space S between the cylindrical bodies 53a. Examples of the respective materials for constituting the first and second regions R1, R2 include those for the second and first regions R2, R1 in the optical element 10 in the first embodiment.

The photodetector of the sixth embodiment may have its optical element 50 in another mode. For example, the plurality of cylindrical bodies 53a may be arranged into a square lattice instead of the triangular lattice. The part constituting the first region may be formed by a plurality of rod-shaped bodies extending in a direction perpendicular to the predetermined direction, instead of the plurality of cylindrical bodies having a height in the predetermined direction, which are arranged on the same plane as with the slit forms in the optical element in the fifth embodiment, so as to construct the structure.

Seventh Embodiment

Figure 14:
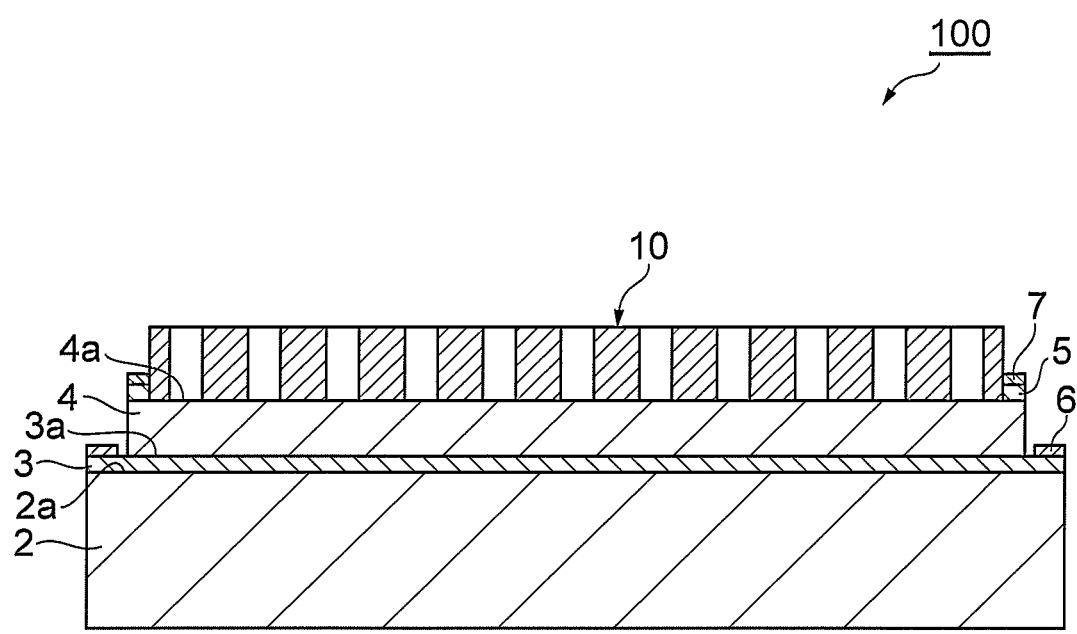
FIG. 14 is a sectional view of the optical element in accordance with the sixth embodiment of the present invention.

Another embodiment of the photodetector will now be explained as the seventh embodiment of the present invention. The photodetector 100 of the seventh embodiment differs from the photodetector 1 of the first embodiment in that, as illustrated in FIG. 14, the contact layer 5 is provided not throughout the surface 4a of the semiconductor multilayer body 4 but only directly under the electrode 7 and consequently that the optical element 10 is directly disposed on the surface 4a of the semiconductor multilayer body 4. As can be seen from results of calculations (FIG. 16) which will be explained later, when light passes through an optical element, electric field components in the predetermined direction appear most strongly in the vicinity of the surface on the light exit side of the optical element. Since the optical element 10 and semiconductor multilayer body 4 are directly in contact with each other, the photodetector 100 of this embodiment exhibits a higher sensitivity for detecting light than the photodetector 1 of the first embodiment.

The photodetector of the seventh embodiment may have the optical element 10 in another mode. For example, the optical elements in the second to sixth embodiments may be employed in place of the optical element 10.

Though preferred embodiments of the present invention have been explained in the foregoing, the present invention is not limited thereto at all. For example, a material known as metamaterial whose permittivity and permeability are artificially manipulated by a fine processing technique as disclosed in a literature (M. Choi et al., "A terahertz metamaterial with unnaturally high refractive index", Nature, 470, 369 (2011)) may be used as a material constituting the first and second regions.

In the photodetector of the present invention, the optical element may generate an electric field component in a predetermined direction either when light is incident thereon from one side in the predetermined direction or through the semiconductor multilayer body from the other side. That is, the optical element of the present invention generates an electric field component in a predetermined direction when light is incident thereon along the predetermined direction.

EXAMPLES

An electric field strength distribution near the light exit side was calculated for the optical element in the present invention. How the conversion efficiency into an electric field component in the predetermined direction varied when changing the difference between the respective refractive indexes of the first and second regions was also calculated for the optical element in the present invention.

[Electric Field Strength Distribution]

The optical element 10 illustrated in FIG. 13 was employed. The thickness of the optical element 10 and the constituent materials and sizes of the first and second regions R1, R2 are as follows:

Thickness of the optical element: 0.5 μm

First region: germanium (refractive index 4.0), width 0.7 μm

Second region: air (refractive index 1.0), width 0.8 μm

Figure 15:
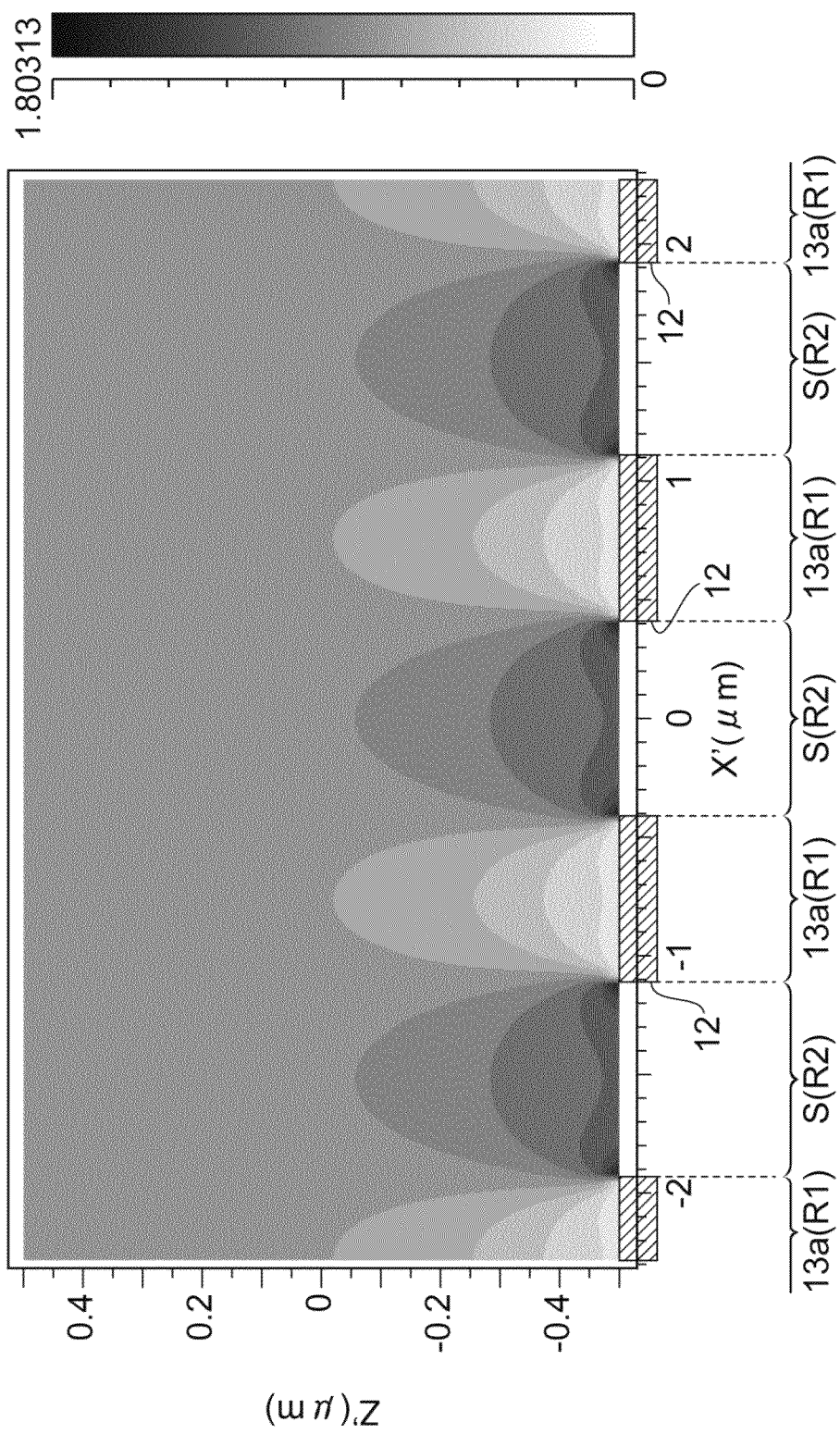
FIG. 15 is an electric field strength distribution according to an FDTD method concerning the optical element of FIG. 11.
Figure 16:
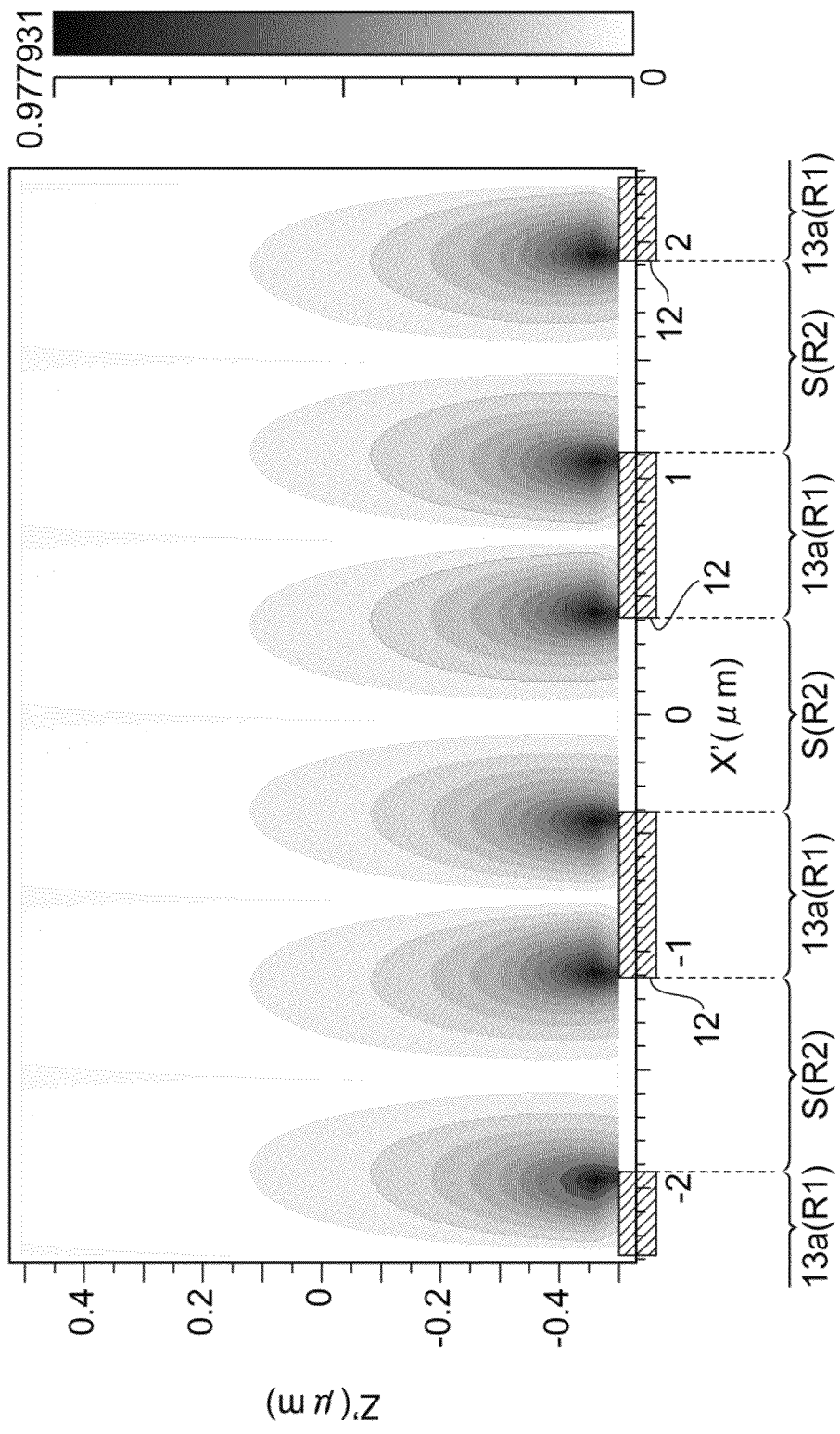
FIG. 16 is an electric field strength distribution according to the FDTD method concerning the optical element of FIG. 11.

The electric field strength distribution was calculated by a successive approximation method known as FDTD (Finite-Difference Time-Domain) method. FIGS. 15 and 16 illustrate the results. Here, the incident light is a planar wave having a wavelength of 5 μm directed from the lower side to the upper side in FIG. 16 (i.e., in the predetermined direction). FIG. 15 illustrates the strength of an electric field component in a direction along a plane formed by the first and second regions R1, R2 (i.e., a plane perpendicular to the predetermined direction) in the optical element 10, while FIG. 16 illustrates the strength of an electric field component perpendicular to this plane.

The results of calculations have verified that the incident light is modulated while passing through the first and second regions R1, R2 in the optical element 10, so that at least a part of light having no electric field component in the predetermined direction attains an electric field component in the predetermined direction. It has been seen from FIG. 16 that the electric field component in the predetermined direction extends in the exiting direction of the incident light from near the boundary between the first and second regions R1, R2 in the exit-side surface of the optical element 10 in the vicinity of the optical element 10, so as to localize. On the other hand, an electric field component not converted to an electric field component in the predetermined direction by the modulation of the incident light has been seen to propagate to the far side of the optical element 10 together with the light having passed through the first and second regions R1, R2.

In other words, as is clear from FIG. 16, an electric field component in the light propagation direction, which cannot occur in light propagating through free spaces, is seen to occur. While the electric field component extending along the plane formed by the first and second regions R1, R2 propagates to parts distanced from the optical element 10 as illustrated in FIG. 15, the electric field component in the predetermined direction localizes in the vicinity of the optical element 10 as illustrated in FIG. 16. This shows that the action by the optical element 10 is not caused by a simple diffraction as disclosed in Japanese Patent Application Laid-Open No. 2000-156513.

The results of calculations show that, in order for light having no electric field component in the predetermined direction to be modulated such as to attain an electric field component in the predetermined direction, the optical element is not necessarily made of a metal (intervention of free electrons is unnecessary). That is, it has been derived from a simulation that effects on a par with or better than those in the case utilizing a metal can be obtained by employing a periodic structure made of a material having no free electrons such as a dielectric body.

[Conversion Efficiency of Electric Field Component vs. Refractive Index Difference]

Figure 17:
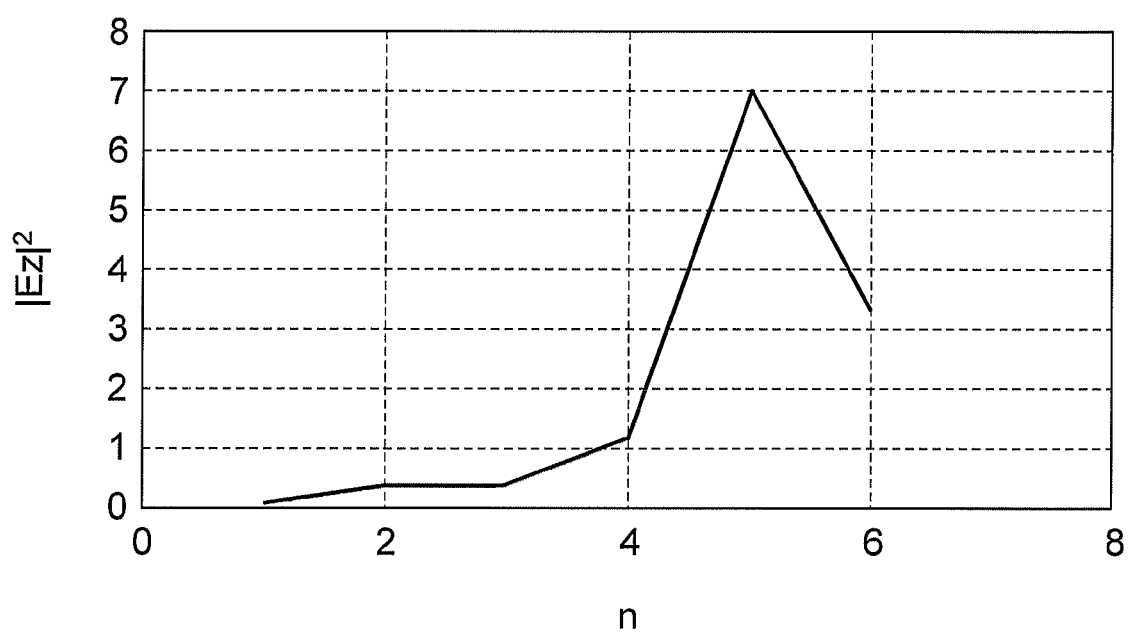
FIG. 17 is a graph illustrating the conversion efficiency of an electric field component vs. the refractive index difference concerning the optical element of FIG. 11.

Next, how the conversion efficiency into an electric field component in the predetermined direction varied when changing the difference between the respective refractive indexes of the first and second regions was calculated. The thickness of the above-mentioned optical element 10 was changed to 0.2 μm, and how the efficiency in converting an electric field component in a direction perpendicular to the predetermined direction into an electric field component in the predetermined direction varied when changing the refractive index of the first region R1 was calculated. FIG. 17 illustrates the results. It is seen from FIG. 17 that an electric field component in the predetermined direction does not occur when the refractive index n of the first region is 1.0, i.e., equal to that of the air constituting the second region, but the strength of the electric field component in the predetermined direction increases as the refractive index of the first region R1 becomes greater.

Figure 18:
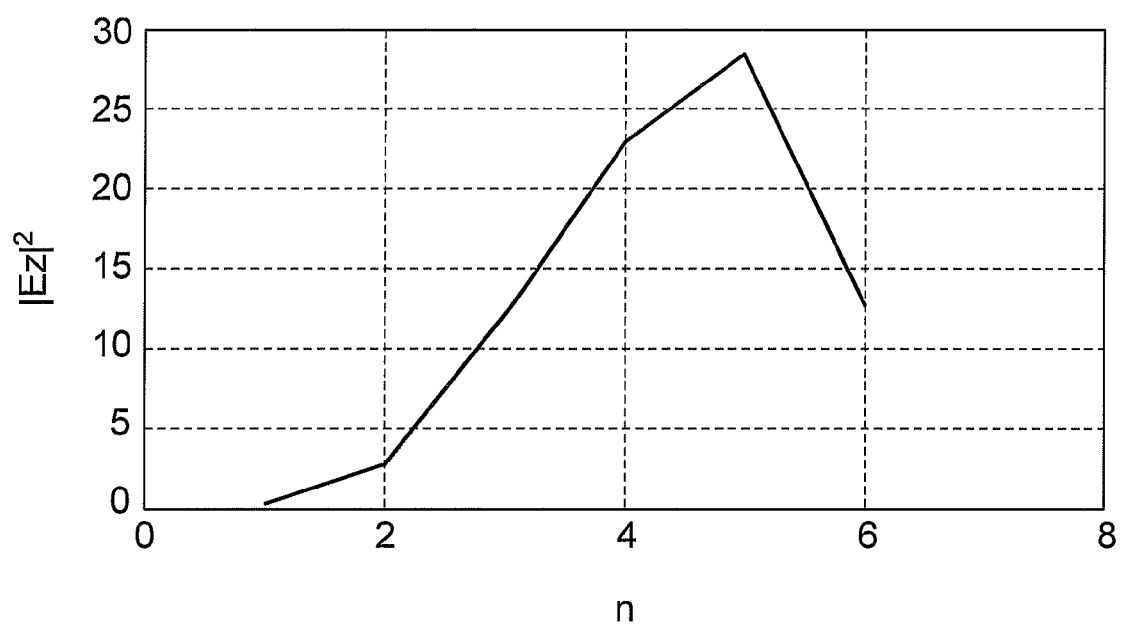
FIG. 18 is a graph illustrating the conversion efficiency of an electric field component vs. the refractive index difference concerning the optical element of FIGS. 9 and 10.

Using the optical element 40 illustrated in FIGS. 9 and 10, the conversion efficiency of the electric field component was similarly calculated. The optical element 40 was configured such that the first region R1 had a diameter of 1.75 μm, a thickness of 0.25 μm, and a period d of 2.9 μm with respect to the second region R2. How the efficiency in converting an electric field component in a direction perpendicular to the predetermined direction into an electric field component in the predetermined direction varied when changing the refractive index of the first region R1 was calculated. FIG. 18 illustrates the results. It is seen from FIG. 18 that an electric field component in the predetermined direction does not occur when the refractive index n of the first region is 1.0, i.e., equal to that of the air, but the strength of the electric field component in the predetermined direction increases as the refractive index of the first region R1 becomes greater. Thus obtained strength of the electric field component is four times that of the optical element 10 of FIG. 11 for which the results of calculations are illustrated in FIG. 17.

[Change in Electric Field Intensity According to Change in Width Ratio Between First and Second Regions]

While the period in the first region (germanium) and second region (air) was kept constant at 3.2 μm, how the spectrum of perpendicular electric field intensity varied when their width ratio was changed was calculated by the FDTD method. The thickness of the first and second regions was 0.8 μm.

Figure 19:
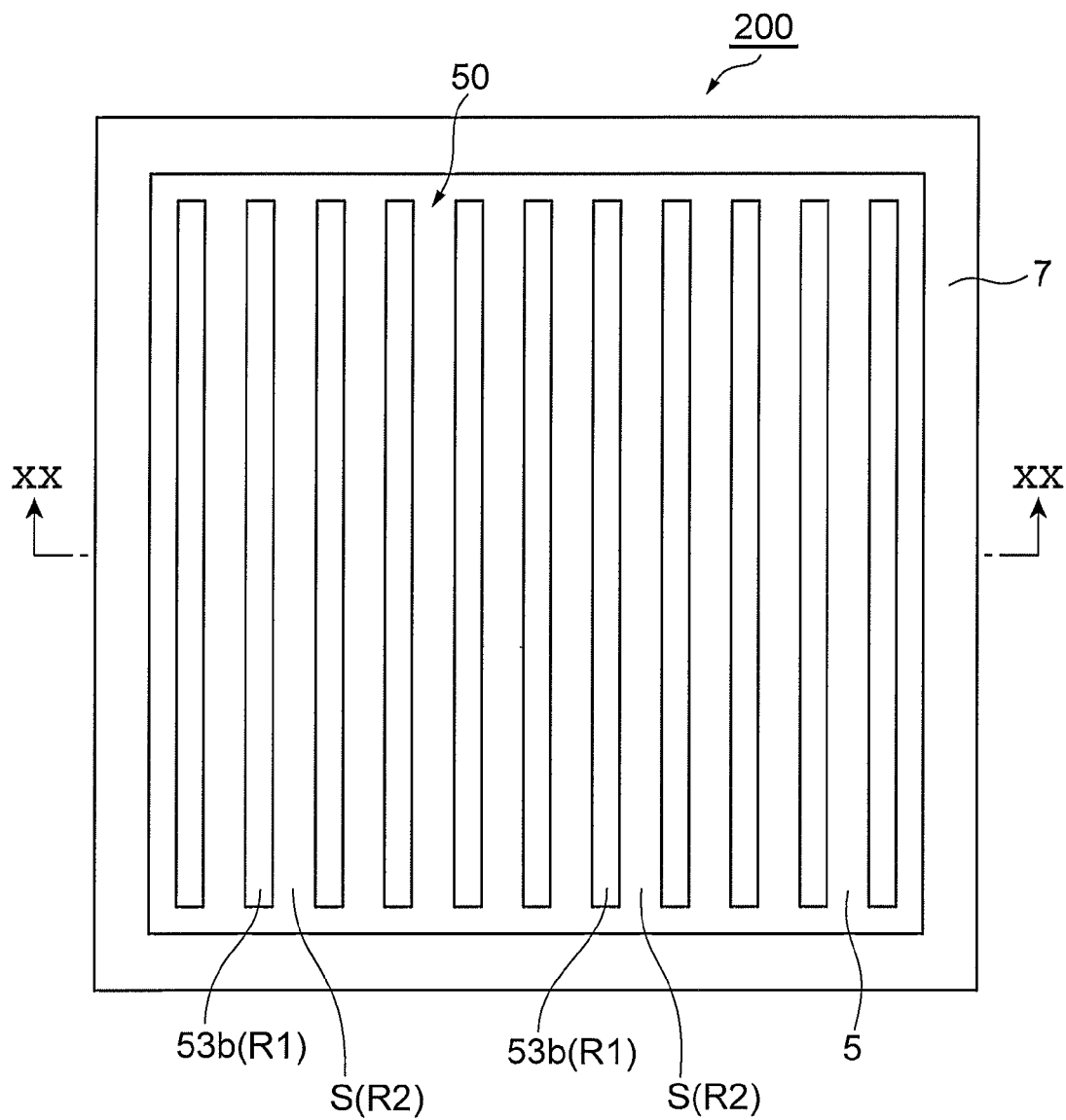
FIG. 19 is a plan view of a photodetector used in a simulation.
Figure 20:
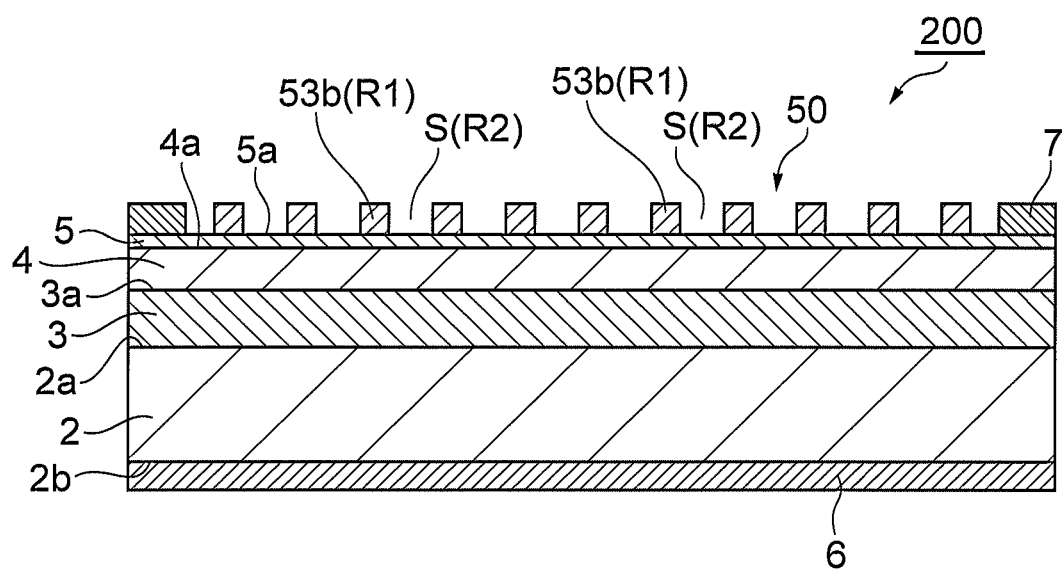
FIG. 20 is a sectional view taken along the line XX-XX of FIG. 19.

An optical element 50 and a photodetector 200 which are illustrated in FIGS. 19 and 20 were used as subjects. The optical element 50 is one in which a plurality of rod-shaped bodies 53b (first regions R1) each extending in a direction perpendicular to a predetermined direction are arranged in parallel with each other so as to form stripes with spaces S (second region R2). The photodetector 200 differs from the photodetector 1 in that it uses the optical element 50 and a substrate 2 constituted by n-type InP and that the second electrode 6 is disposed throughout a surface 2b of the substrate 2 on the side opposite from the surface 2a.

Figure 21:
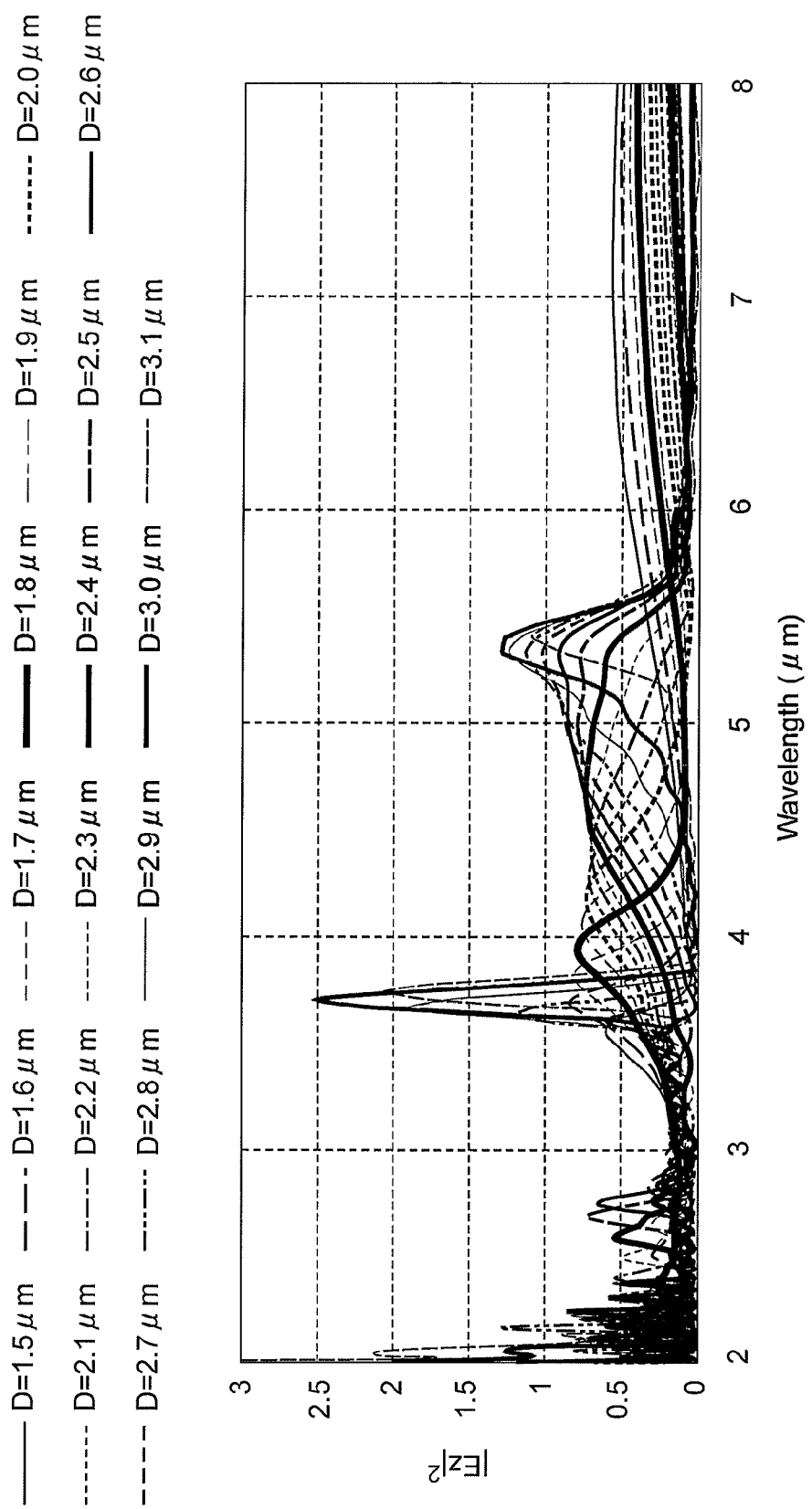
FIG. 21 is a perpendicular electric field intensity spectrum according to the FDTD method concerning the optical element used in the photodetector of FIG. 19.

FIG. 21 illustrates results of a simulation. In FIG. 21, D indicates the linewidth (μm) of germanium. It is seen from these results that the perpendicular electric field intensity tends to become greater with respect to the incident light in the infrared region when the linewidth of germanium is not smaller than that of the air (i.e., when the width of the first region is not smaller than that of the second region). For example, acute peaks are seen in a wavelength region where the ratio of germanium to air is 2.8:0.4 to 3.1:0.1. In particular, the maximum perpendicular electric field is seen to be obtained when infrared light having a wavelength of 3.7 μm or 5.3 μm is incident in the case where the linewidth of germanium is 3.0 μm. Utilizing such a simulation, the optical element can be designed in terms of the relationship between the period and linewidth (or diameter) of the first and second regions or the interrelationship between two kinds of linewidth so as to maximize the electric field intensity obtained at the wavelength of incident light.

What is claimed is:

1. A photodetector comprising:
   an optical element for transmitting light therethrough along a predetermined direction and modulating the light,
   the optical element comprising a structure having first regions and second regions periodically arranged with respect to the first regions along a plane perpendicular to the predetermined direction;
   wherein the first and second regions have respective refractive indexes different from each other, and properties of transmitting the light therethrough;
   the light having no electric field component in the predetermined direction is modulated such as to attain an electric field component in the predetermined direction;
   a semiconductor multilayer body arranged on the other side opposite to one side in the predetermined direction with respect to the optical element and adapted to generate a current due to an electric field component in the predetermined direction in the light transmitted through the optical element;
   a first contact layer formed on a surface on the one side of the semiconductor multilayer body; and
   a second contact layer formed on a surface on the other side of the semiconductor multilayer body.

2. A photodetector according to claim 1, further comprising a substrate having the second contact layer, semiconductor multilayer body, first contact layer, and optical element sequentially stacked thereon from the other side.

3. A photodetector according to claim 1, further comprising:
   a first electrode electrically connected to the first contact layer; and
   a second electrode electrically connected to the second contact layer.

4. A photodetector according to claim 1, wherein the optical element generates the electric field component in the predetermined direction when light is incident thereon from the one side.

5. A photodetector according to claim 1, wherein the optical element generates the electric field component in the predetermined direction when light is incident thereon through the semiconductor multilayer body from the other side.

6. A photodetector according to claim 1, wherein the difference between the refractive indexes of the first and second regions is 2 or greater.

7. A photodetector according to claim 1, wherein the first and second regions are arranged with a period of 1 to 500 μm.

8. A photodetector according to claim 1, wherein the light is an infrared ray.

9. A photodetector according to claim 1, wherein the structure has a film body provided with a plurality of through holes penetrating therethrough along the predetermined direction;
   wherein the first region is a part between the through holes in the film body; and
   wherein the second region is a space within the through hole.

10. A photodetector according to claim 1, wherein the structure has a film body provided with a plurality of through holes penetrating therethrough along the predetermined direction and an embedded member held within the through hole;
    wherein the first region is a part between the through holes in the film body; and
    wherein the second region is the embedded member.

11. A photodetector according to claim 1, wherein the structure has a film body provided with a plurality of depressions opening to one side or the other side in the predetermined direction;
    wherein the first region is a part between the depressions in the film body; and
    wherein the second region is a space within the depression.

12. A photodetector according to claim 1, wherein the structure has a film body provided with a plurality of depressions opening to one side or the other side in the predetermined direction and an embedded member held within the through hole;
    wherein the first region is a part between the depressions in the film body; and
    wherein the second region is the embedded member.

13. A photodetector according to claim 1, wherein the structure has a film body provided with a plurality of projections projecting to one side or the other side in the predetermined direction;
    wherein the first region is the projection; and
    wherein the second region is a space between the projections.

14. A photodetector according to claim 1, wherein the structure has a film body provided with a plurality of projections projecting to one side or the other side in the predetermined direction and an embedded member held between the projections;
    wherein the first region is the projection; and
    wherein the second region is the embedded member.

15. An optical element for transmitting light therethrough along a predetermined direction and modulating the light,
    the optical element comprising a structure having first regions and second regions periodically arranged with respect to the first regions along a plane perpendicular to the predetermined direction;
    wherein the first and second regions have respective refractive indexes different from each other, and properties of transmitting the light therethrough;

the light having no electric field component in the predetermined direction is modulated such as to attain an electric field component in the predetermined direction, wherein the first regions are made of germanium.

16. An optical element according to claim 15, wherein the difference between the refractive indexes of the first and second regions is 2 or greater.

17. An optical element according to claim 15, wherein the first and second regions are arranged with a period of 1 to 500 µm.

18. An optical element according to claim 15, wherein the light is an infrared ray.

19. An optical element according to claim 15, wherein the structure has a film body provided with a plurality of through holes penetrating therethrough along the predetermined direction;

wherein the first region is a part between the through holes in the film body; and wherein the second region is a space within the through hole.

20. An optical element according to claim 15, wherein the structure has a film body provided with a plurality of through holes penetrating therethrough along the predetermined direction and an embedded member held within the through hole;

wherein the first region is a part between the through holes in the film body; and wherein the second region is the embedded member.

21. An optical element according to claim 15, wherein the structure has a film body provided with a plurality of depressions opening to one side or the other side in the predetermined direction;

wherein the first region is a part between the depressions in the film body; and wherein the second region is a space within the depression.

22. An optical element according to claim 15, wherein the structure has a film body provided with a plurality of depressions opening to one side or the other side in the predetermined direction and an embedded member held within the through hole;

wherein the first region is a part between the depressions in the film body; and wherein the second region is the embedded member.

23. An optical element according to claim 15, wherein the structure has a film body provided with a plurality of projections projecting to one side or the other side in the predetermined direction;

wherein the first region is the projection; and wherein the second region is a space between the projections.

24. An optical element according to claim 15, wherein the structure has a film body provided with a plurality of projections projecting to one side or the other side in the predetermined direction and an embedded member held between the projections;

wherein the first region is the projection; and wherein the second region is the embedded member.

* * * * *

UNITED STATES PATENT AND TRADEMARK OFFICE
CERTIFICATE OF CORRECTION

PATENT NO. : 8,853,809 B2
APPLICATION NO. : 13/888656
DATED : October 7, 2014
INVENTOR(S) : Kazutoshi Nakajima et al.

It is certified that error appears in the above-identified patent and that said Letters Patent is hereby corrected as shown below:

Title Page, Item (72) "Inventors"

change "Wataru Aka-Hori" to --Wataru Akahori--

Signed and Sealed this
Seventeenth Day of February, 2015

Michelle K. Lee
*Deputy Director of the United States Patent and Trademark Office*